United States Patent [19]

Hasenberg et al.

[11] Patent Number: 5,577,061
[45] Date of Patent: Nov. 19, 1996

[54] SUPERLATTICE CLADDING LAYERS FOR MID-INFRARED LASERS

[75] Inventors: Thomas C. Hasenberg, Agoura Hills; David H. Chow, Newbury Park, both of Calif.

[73] Assignee: Hughes Aircraft Company, Los Angeles, Calif.

[21] Appl. No.: 359,751

[22] Filed: Dec. 16, 1994

[51] Int. Cl.$^6$ ................................................. H01S 3/19
[52] U.S. Cl. ................................................. 372/45; 372/43
[58] Field of Search ................................. 372/45, 43, 46

[56] References Cited

U.S. PATENT DOCUMENTS

| | | | |
|---|---|---|---|
| 4,882,734 | 11/1989 | Scifres et al. | 372/45 |
| 5,007,063 | 4/1991 | Kahen | 372/45 |
| 5,251,225 | 10/1993 | Eglash et al. | 372/45 |

FOREIGN PATENT DOCUMENTS

| | | | |
|---|---|---|---|
| 60-130878 | 7/1985 | Japan | 372/45 |
| 61-154191 | 7/1986 | Japan | 372/45 |
| 61-181185 | 8/1986 | Japan | 372/45 |
| 62-51282 | 3/1987 | Japan | 372/45 |
| 63-245984 | 10/1988 | Japan | 372/45 |

OTHER PUBLICATIONS

Shen et al, "Remote n–type modulation doping of InAs quantum wells by 'deep acceptors' in AlSb", Journal of Applied Physics. 73(12), June 15 1993, pp. 8313–8318.

Choi, H. K., Eglash, S., "High–Efficiency High–Power GaLnAsSb—AlGaAsSb Double–Heterostructure Lasers Emitting a t 2.3 microns", IEEE Journal of Quantum Electronics, vol 27, No. 6, Jun. 1991 pp. 1555–1559.

"High–power multiple–quantum–well GaInAsSb/AlGaAsSb diode lasers emitting at 2.1 μm with low threshold current density", H. K. Choi et al, Applied Physics Letters, vol. 61(10), pp. 1154–1156 (7 Sep. 1992).

"InAsSb/AlAsSb double–heterostructure diode lasers emitting at 4 μm", S. J. Eglash et al, Applied Physics Letters, vol. 64(7), pp. 883–835 (14 Feb. 1994).

*Primary Examiner*—Rodney B. Bovernick
*Assistant Examiner*—Yisun Song
*Attorney, Agent, or Firm*—V. D. Duraiswamy; W. K. Denson-Low

[57] ABSTRACT

A mid-IR laser is provided having novel AlAs/Al$_x$Ga$_{1-x}$Sb or InAs/Al$_x$Ga$_{1-x}$Sb superlattice cladding regions. The arsenide layers of the n-type cladding region are doped n-type, utilizing silicon, and may be used with conventional active region materials, such as InAs$_z$Sb$_{1-z}$ and In$_w$Ga$_{1-w}$As$_y$Sb$_{1-y}$. The novel cladding regions can be deposited without the use of Group VI elements, such as Te, which are not preferred source materials for MBE growth. Furthermore, the need for quaternary layers, such as Al$_x$Ga$_{1-x}$As$_y$Sb$_{1-y}$, used in the prior art devices, is eliminated; consequently, the need for precise control of two Group V fluxes (As and Sb) is eliminated.

18 Claims, 2 Drawing Sheets

5,577,061

SUPERLATTICE CLADDING LAYERS FOR MID-INFRARED LASERS

ORIGIN OF INVENTION

This invention was made with Government support under Contract No. F29601-93-C-0037 awarded by the Air Force. The Government has certain rights in this invention.

BACKGROUND OF THE INVENTION

1. Field of the Invention

The present invention is directed to mid-infrared (mid-IR) lasers, that is, lasers operating in the region of about 2 to 8 µm. More particularly, the present invention is directed to n-type cladding layers which efficiently confine holes in such lasers.

2. Description of Related Art

Present mid-range IR laser diodes comprise GaInAsSb/AlGaAsSb layers, where the GaInAsSb alloy is the active layer and the AlGaAsSb alloy is the cladding layer. However, these laser diodes suffer from several disadvantages. First, these laser diodes require the use of tellurium (or other Group VI) as the dopant element, which is not a preferred dopant used in III–V molecular beam epitaxial (MBE) growth processes. Second, accurate control of the flux ratio of As:Sb and substrate temperature, which affect quaternary composition, are required for growth of useful devices. Third, the laser diodes are limited to wavelengths shorter than 4.2 µm (for unstrained active layers), which limits their usefulness in certain applications.

Thus, there remains a need for a mid-IR laser which avoids most, if not all, of the foregoing problems.

SUMMARY OF THE INVENTION

In accordance with the present invention, a mid-IR laser is provided having a novel superlattice cladding region. In one embodiment the cladding region may comprise AlAs/$Al_xGa_{1-x}$Sb superlattices, while in another embodiment, the cladding region may comprise InAs/$Al_xGa_{1-x}$Sb superlattices. An active region is sandwiched between n-type and p-type superlattice cladding layers. The arsenide layers of the n-type cladding region are doped n-type, using silicon as a dopant, and may be used with conventional active region materials, such as $InAs_zSb_{1-z}$ and $In_wGa_{1-w}As_ySb_{1-y}$.

The novel cladding regions of the present invention can be deposited without the use of Group VI elements, such as Te, which are not preferred dopant source materials for MBE growth. Furthermore, the need for quaternary layers, such as $Al_xGa_{1-x}As_ySb_{1-y}$, used in the prior art devices is eliminated; consequently, the need for precise control of two Group V fluxes (As and Sb) is eliminated.

DESCRIPTION OF THE PREFERRED EMBODIMENTS

The laser of the present invention operates like any semiconductor laser diode. An active region is sandwiched between B-type and p-type cladding layers. The diode is forward biased and electrons are injected into the active region from the n-type cladding region, while holes are injected from the p-type cladding region. Since the active region has a smaller bandgap than the cladding regions, the electrons and holes are confined in the active region, and most of them recombine radiatively. The photons generated in the active region are optically guided, since the index of refraction is higher in the active region than in the cladding layers. Hence, the cladding layers confine the carriers as well as the light to thereby form a waveguide. The present invention is considered unique in that selectively-doped "superlattice" cladding layers are employed. As used herein, the term "superlattice" refers to an alternating structure comprising a plurality of layers of two different semiconductor compounds, each layer being typically in the range of about 3 to 100 Å.

A. AlAs/AlGaSb Cladding Layers

Figure 1:
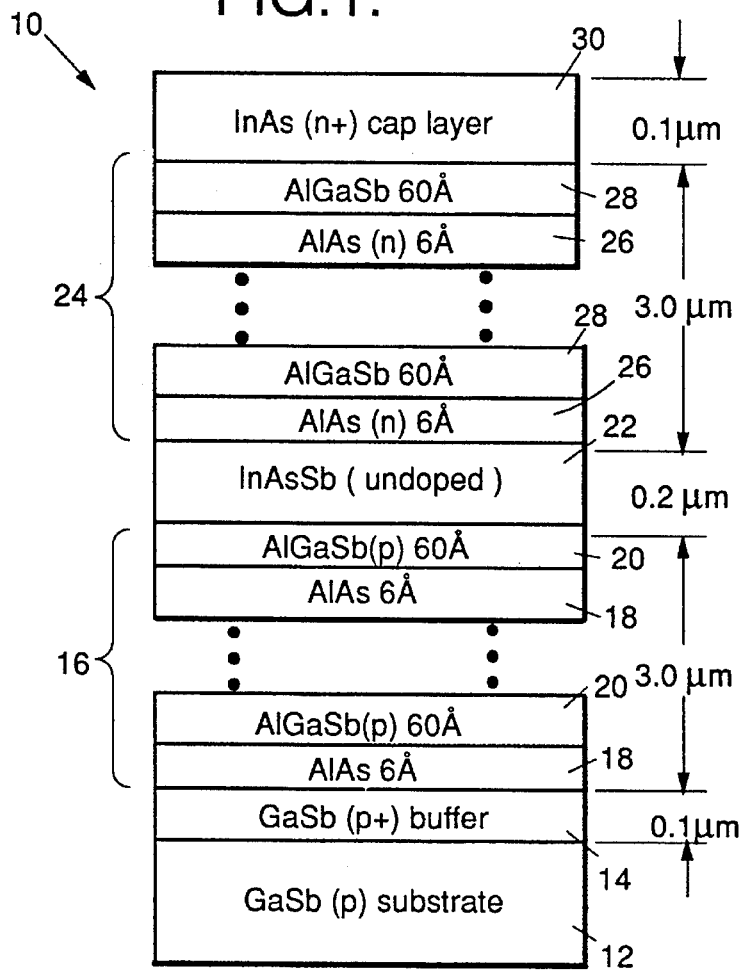
FIG. 1 is a cross-sectional view, depicting one embodiment of the superlattice-clad laser diode of the present invention.

FIG. 1 depicts one example of the superlattice-clad laser diode of the present invention. In this embodiment, an AlAs/AlGaSb superlattice laser structure 10 is formed on a p-doped GaSb substrate 12. A $p^+$-doped GaSb buffer layer 14 is formed on the substrate 12, as is conventional in this art. Next, a first superlattice clad layer 16 (p-type) comprises alternating layers of undoped AlAs 18 and p-doped AlGaSb 20 and is formed on the buffer layer 14. An active layer 22 comprising undoped InAsSb is formed on the first clad layer 16. A second superlattice clad layer 24 (n-type) comprises alternating layers of n-doped AlAs 26 and undoped AlGaSb 28 and is formed on the active layer 22. A cap layer comprising $n^+$-doped InAs is formed on top of the second clad layer 24, completing the structure 10. The active region 22 may comprise conventional active region materials such as InAsSb or InGaAsSb. As an example, InAsSb, given by the formula $InAs_zSb_{1-z}$ wherein z is within the range of about 0.5 to 1, or InGaAsSb, given by the formula $In_wGa_{1-w}As_ySb_{1-y}$ wherein w is within the range of about 0.09 to 1 and y is within the range of about 0.087 to 0.91, may be used.

As an example, the buffer layer 14 is about 0.1 µm in thickness, the first and second clad layers 16 and 24 are each about 3.0 µm in thickness, comprising AlAs layers 18 and 26 of 6 Å and AlGaSb layers 20 and 28 of 60 Å in thickness, the active region 22 is about 0.2 µm in thickness, and the cap layer 30 is about 0.1 µm in thickness, wherein the alternating layers can comprise AlAs and $Al_xGa_{1-x}$Sb, and AlGaSb is given by the formula $Al_xGa_{1-x}$Sb where x is within the range of 0 to 1, or, preferably, is within the range of 0.4 to 1. The p-AlGaSb layers 20 are doped with beryllium, while the n-AlAs layers 26 are doped with silicon.

Figure 2:
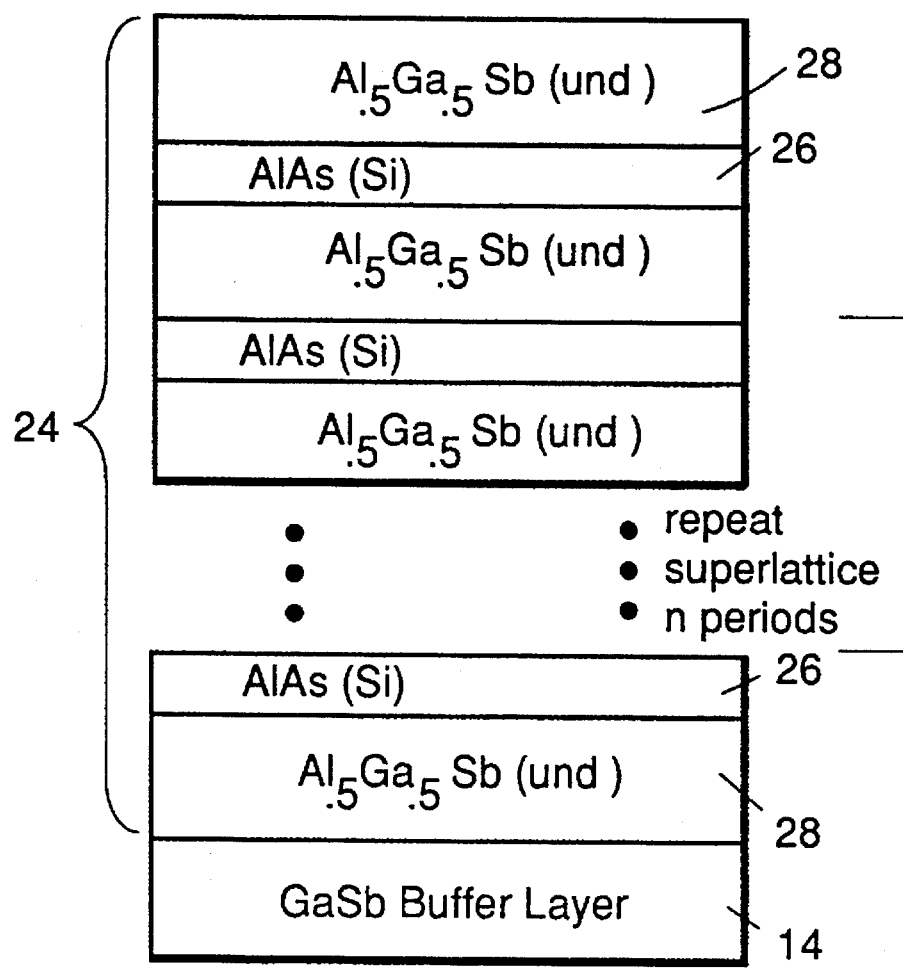
FIG. 2 is a cross-sectional view depicting a schematic layer sequence diagram of an n-type AlAs/$Al_xGa_{1-x}$Sb superlattice cladding layer used in the laser diode of FIG. 1.

A schematic layer sequence diagram of the n-type AlAs/$Al_xGa_{1-x}$Sb superlattice cladding layer 24 is depicted in FIG. 2. In this structure, the AlAs layers 26 are doped with silicon to a value of about $5\times10^{18}$ $cm^{-3}$ to make them n-type. The $Al_xGa_{1-x}$Sb layers 28 are left undoped. The thickness of the AlAs(Si) layers 26 is, for example, about 2 monolayers, while the thickness of the AlGaSb(und) layers 28 is about 20 monolayers. As used herein, the term "(und)" indicates undoped. The conduction band of the AlAs layers is at or above that of the $Al_xGa_{1-x}$Sb layers (for x values below about 0.6). Therefore, the flee electrons present from the Si doping in the AlAs layers reside in the $Al_xGa_{1-x}$Sb layers (selective doping). The result is a predominantly antimonide layer (Sb:As >>10:1) doped n-type with silicon, which would be a p-type dopant in a bulk alloy layer with the same average composition. Because of its AlAs content, the cladding layer is effective at confining both electrons and holes in mid-infrared laser structures. In the structure depicted in FIG. 2, the value of x=0.5.

As depicted in FIGS. 1 and 2, it is immaterial whether the superlattice clad structure 16, 24 starts with AlAs or with AlGaSb on the buffer layer 14 or the active layer 22. Preferably, however, AlGaSb is used as the top layer of each cladding layer 16, 24.

The thickness of the AlAs layers 18, 26 ranges from about 3 to 9 Å (1 to 3 monolayers), and preferably is about 3 Å. The thickness of the AlGaSb layers 20, 28 ranges from about 20 to 60 Å, and preferably is about 30 Å. Most preferably, the ratio of thickness of the two layers, AlAs:AlGaSb is 1:10.

The substrate 12 material of choice for this combination is either GaSb or InAs. InAs as the substrate material is preferred, since it is easier for lattice-matching the AlAs/AlGaSb layers as compared to GaSb.

AlAs(Si)/AlGaSb superlattices matched to GaSb with n-type carrier concentrations in excess of $1 \times 10^{18}$ $cm^{-3}$ have been grown. Further, diode lasers employing this superlattice structure have been fabricated. However, lasing has not yet been observed, which is believed to be due to excessive lattice mismatch resulting from the difficulty of precisely controlling the amount of cross-incorporation of As in the AlGaSb. It is expected that further refinements of the growth of the superlattices will result in lasing of these structures.

B. InAs/AlSb Cladding Layers

An alterative embodiment to that described above is to use InAs in place of AlAs. AlGaSb may be used as the alternating layer. However, in the formula $Al_xGa_{1-x}Sb$, x is preferably 1, so that the alternating set of layers is InAs/AlSb. While the bandgap for the InAs/AlSb structure is not as large as that of the AlAs/AlGaSb superlattice cladding structure, and thus carrier confinement is not as good, nevertheless, it is not necessary to grow such thin As-containing layers. Rather, both layers may be approximately the same thickness, say 24 Å (8 monolayers each).

As with n-AlAs, on the n-type cladding side 24, n-InAs is doped with silicon. On the p-type cladding side 16, p-AlGaSb is doped with beryllium, as above.

The thickness of both InAs and AlGaSb ranges from about 3 to 50 Å, and preferably from about 19 to 25 Å. Most preferably, the ratio of thickness of the two layers is 1:1.

The substrate 12 material of choice for this combination is GaSb.

The InAs/AlSb structure is easier to grow by MBE than the AlAs/AlGaSb structure, due to the relaxing of thickness constraints. Indeed, several diode lasers were built with the InAs/AlSb cladding structure, and lasing was observed in the range of 2.24 to 3.90 μm.

C. Additional Considerations

Growth of the diodes employing either AlAs/AlGaSb cladding layers or InAs/AlSb cladding layers is performed using conventional MBE procedures, and thus forms no part of the present invention.

AlAs(Si)/AlGaSb(und) superlattices have been studied as laser cladding layers because they should provide excellent optical and carder confinement. In particular, the superlattice clads should provide excellent hole confinement in contrast to poor confinement of most mid-IR laser structures. Laser cladding layers must have a mobility which is sufficiently high to yield a low series resistance. Although electrons or holes are not expected to be trapped in the small band gap AlSb layers, measurement of vertical transport in diode structures incorporating these superlattices has been made. The current-voltage characteristics for p-InAs (n-AlAs/AlSb) diodes recently fabricated suggest that the electrons are mobile in the superlattice. The results also show that the superlattice can be made sufficiently n-type by doping the AlAs layers alone.

The diodes comprise p-type InAs(Be) grown on an n-type AlAs(Si)/AlSb(und) superlattice. Be was used to dope the InAs and Si to dope the AlAs layers in the superlattice. These p-n junctions were grown on top of a 0.6 μm thick n-type InAs buffer layer separated from an n-type GaAs substrate by an n-InAs/GaAs short-period superlattice buffer layer.

Figure 3:
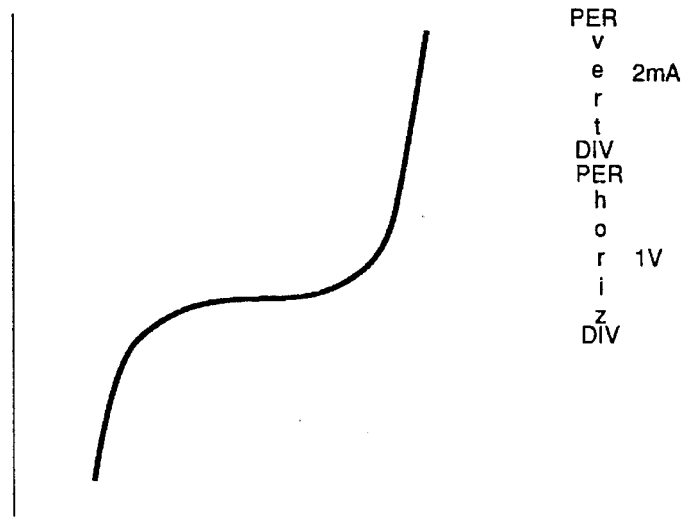
FIG. 3, on coordinates of current and voltage, is an I–V plot for a diode comprising InAs(Be) grown on an n-type AlAs(Si)/AlSb(und) superlattice.

After applying contacts to the front and back surfaces of the samples, mesas of various sizes were etched into the samples. The etchant appears to have gone through the upper InAs layer and superlattice and into the InAs buffer. Au/Ge-Ni-Au contacts and Au contacts were employed on the back side of the n-GaAs substrate and on the p-InAs cap, respectively. Current-voltage characteristics were measured with a probe on the top contact and a probe on the conductive base plate that supports the sample. FIG. 3 shows an I–V curve for a 300 μm×2 μm mesa. The 12 mA peak current corresponds to a current density of 2 $kA/cm^2$, which should be more than adequate for a laser diode. The somewhat rounded knee in the low current pan of the curve is indicative of significant generation-recombination in the quasi-neutral region of the diode.

The performance of the diodes depends on the manner in which the superlattices were doped. For some of the diodes, the Al half-monolayer at the interface between AlAs and AlSb was Si doped. These diodes out-performed those with no doping in these layers. In AlSb (or AlGaSb), Si would be expected to incorporate at the Sb sites as p-type dopant. However, the present inventors have found that Si is incorporated at Al sites (n-type dopant) when the Al is sandwiched between As and Sb layers.

A double heterostructure has been grown with an InAs active layer sandwiched between n- and p-type AlAs/AlSb superlattice cladding layers. Optical (PL) and electrical characterization of this sample is in progress.

The mid-IR lasers fabricated in accordance with the present invention can be used in hydrocarbon sensors, which have automotive and environmental applications. These sensors could be deployed in mines, tunnels, ship bilges, refineries, and the like. Use of the cladding superlattice of the invention avoids the necessity of using tellurium (or other Group VI) as a dopant.

Thus, there has been disclosed a laser diode for use at mid-IR frequencies, employing a novel cladding superlattice structure. It will be readily apparent to those skilled in this art that various changes and modifications of an obvious nature may be made, and all such changes and modifications are considered to fall within the scope of the invention, as defined by the appended claims.

What is claimed is:

1. A laser diode for use at mid-infrared frequencies, said laser diode including an active layer having a top surface and a bottom surface and a first p-type cladding region contacting said bottom surface and a second n-type cladding region contacting said top surface, wherein said first cladding region comprises a plurality of alternating layers of either AlAs or InAs and p-$Al_xGa_{1-x}$Sb and wherein said second cladding region comprises a plurality of alternating layers of either n-AlAs or n-InAs and $Al_xGa_{1-x}$Sb wherein said $Al_xGa_{1-x}$Sb layers in said second n-type cladding regions are intentionally undoped.

2. A laser diode for use at mid-infrared frequencies, said laser diode including an active layer having a top surface and a bottom surface and a first p-type cladding region contacting said bottom surface and a second n-type cladding region contacting said top surface, wherein said first cladding region comprises a plurality of alternating layers of either AlAs or InAs and p-$Al_xGa_{1-x}$Sb and wherein said second cladding region comprises a plurality of alternating layers of either n-AlAs or n-InAs and $Al_xGa_{1-x}$Sb, wherein said n-AlAs layers in said second n-type cladding region are n-doped with silicon.

3. The laser diode of claim 1 wherein said n-InAs layers in said second n-type cladding region are n-doped with silicon.

4. The laser diode of claim 1 wherein said p-$Al_xGa_{1-x}$Sb layers in said first p-type cladding region are p-doped with beryllium.

5. The laser diode of claim 1 wherein x is within the range of 0 to 1.

6. A laser diode for use at mid-infrared frequencies, said laser diode including an active layer having a top surface and a bottom surface and a first p-type cladding region contacting said bottom surface and a second n-type cladding region contacting said top surface, wherein said first cladding region comprises a plurality of alternating layers of either AlAs or InAs and p-$Al_xGa_{1-x}$Sb and wherein said second cladding region comprises a plurality of alternating layers of either n-AlAs or n-InAs and $Al_xGa_{1-x}$Sb, wherein said alternating layers comprise AlAs and $Al_xGa_{1-x}$Sb and wherein x is within the range of 0.4 to 1.

7. The laser diode of claim 5 wherein said alternating layers comprise InAs and $Al_xGa_{1-x}$Sb and wherein x is 1.

8. A laser diode for use at mid-infrared frequencies, said laser diode including an active layer having a top surface and a bottom surface and a first p-type cladding region contacting said bottom surface and a second n-type cladding region contacting said top surface, wherein said first cladding region comprises a plurality of alternating layers of either AlAs or InAs and p-$Al_xGa_{1-x}$Sb and wherein said second cladding region comprises a plurality of alternating layers of either n-AlAs or n-InAs and $Al_xGa_{1-x}$Sb, wherein said $Al_xGa_{1-x}$Sb layers in said second n-type cladding region are intentionally undoped.

9. The laser diode of claim 1 wherein said active region comprises InAsSb, given by the formula $InAs_zSb_{1-z}$, where z is within the range of about 0.5 to 1.

10. The laser diode of claim 1 wherein said active region comprises InGaAsSb given by the formula $In_wGa_{1-w}$-$As_y$-$Sb_{1-y}$, where w is within the range of about 0.09 to 1 and y is within the range of about 0.087 to 0.91.

11. The laser diode of claim 1 wherein said first and said second cladding region each has a thickness of at least about 2 μm.

12. A laser diode for use at mid-infrared frequencies, said laser diode including an active layer having a top surface and a bottom surface and a first p-type cladding region contacting said bottom surface and a second n-type cladding region contacting said top surface, wherein said first cladding region comprises a plurality of alternating layers of either AlAs or InAs and p-$Al_xGa_{1-x}$Sb and wherein said second cladding region comprises a plurality of alternating layers of either n-AlAs or n-InAs and $Al_xGa_{1-x}$Sb, wherein said first and second cladding regions each comprise alternating layers of AlAs and $Al_xGa_{1-x}$Sb and wherein each AlAs layer has a thickness within the range of about 3 to 9 Å and wherein each $Al_xGa_{1-x}$Sb layer has a thickness within the range of about 20 to 60 Å.

13. The laser diode of claim 12 wherein the ratio of thickness of said AlAs layer to that of said $Al_xGa_{1-x}$Sb layer is about 1:10.

14. The laser diode of claim 13 wherein each AlAs layer has a thickness of about 3 Å and each $Al_xGa_{1-x}$Sb layer has a thickness of about 30 Å.

15. The laser diode of claim 1 wherein said first and second cladding regions each comprise alternating layers of InAs and $Al_xGa_{1-x}$Sb and wherein each InAs layer has a thickness within the range of about 3 to 50 Å and wherein each $Al_xGa_{1-x}$Sb layer has a thickness within the range of about 3 to 50 Å.

16. The laser diode of claim 15 wherein the ratio of thickness of said InAs layer to that of said $Al_xGa_{1-x}$Sb layer is about 1:1.

17. The laser diode of claim 16 wherein each InAs layer has a thickness of about 19 to 25 Å and each $Al_xGa_{1-x}$Sb layer has a thickness of about 19 to 25 Å.

18. A method of making a laser diode for use at mid-infrared frequencies, said laser diode including an active layer having a top surface and a bottom surface and a first p-type cladding region contacting said bottom surface and a second n-type cladding region contacting said top surface, said method comprising (a) providing said first cladding region with a plurality of alternating layers of either AlAs or InAs and p-AlGaSb; and (b) providing said second cladding region with a plurality of alternating layers of either n-AlAs or n-InAs and AlGaSb wherein said AlGaSb layers in said n-type cladding region are intentionally undoped.

* * * * *